United States Patent
Xu et al.

(10) Patent No.: US 10,386,661 B2
(45) Date of Patent: Aug. 20, 2019

(54) ELEVATING MECHANISM

(71) Applicants: BOE Technology Group Co., Ltd., Beijing (CN); Hefei BOE Optoelectronics Technology Co., Ltd., Anhui (CN)

(72) Inventors: Min Xu, Beijing (CN); Zhen Wei, Beijing (CN); Shibo Guo, Beijing (CN); Qiang Zhang, Beijing (CN); Yongbo Gong, Beijing (CN); Mingming Shen, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 74 days.

(21) Appl. No.: 15/656,477

(22) Filed: Jul. 21, 2017

(65) Prior Publication Data

US 2018/0059447 A1   Mar. 1, 2018

(30) Foreign Application Priority Data

Aug. 26, 2016 (CN) .......................... 2016 1 0743003

(51) Int. Cl.
*H01L 21/68* (2006.01)
*G02F 1/13* (2006.01)
(Continued)

(52) U.S. Cl.
CPC ...... *G02F 1/1303* (2013.01); *G02F 1/136204* (2013.01); *G02F 1/1368* (2013.01); *H01L 21/68742* (2013.01)

(58) Field of Classification Search
CPC ............. G02F 1/1303; G02F 1/136204; H01L 21/68742
See application file for complete search history.

(56) References Cited

U.S. PATENT DOCUMENTS

2011/0236162 A1* 9/2011 Shikayama ....... H01L 21/68742
                                                          414/222.01
2011/0315080 A1   12/2011 Choi et al.
(Continued)

FOREIGN PATENT DOCUMENTS

CN   1808280 A    7/2006
CN   102422410 A  4/2012
(Continued)

OTHER PUBLICATIONS

First Office Action, including Search Report, for Chinese Patent Application No. 201610743003.3, dated Nov. 1, 2018, 17 pages.

*Primary Examiner* — Ronald P Jarrett
(74) *Attorney, Agent, or Firm* — Westman, Champlin & Koehler, P.A.

(57) ABSTRACT

An elevating mechanism is provided in the embodiments of the disclosure, which relates to the technical field of a substrate carrying mechanism device and is capable of decreasing incidence of an electrostatic-breakdown phenomenon of a substrate to be processed during an ascending-descending process thereof. The elevating mechanism is configured to carry the substrate to be processed, including a plurality of struts, each of which is provided at a supporting end thereof with a support portion which is in contact with the substrate to be processed, by means of a supporting surface provided on the support portion when the elevating mechanism carries the substrate to be processed; and an ionic wind supply. Each of the plurality of struts is provided with a channel which is arranged inside a corresponding one of the plurality of the struts and penetrates therethrough and is configured to deliver an ionic wind outputted from the ionic wind supply into the corresponding one of the plurality of struts; and each of the plurality of struts is provided at least at a location of the supporting surface on the support portion with a plurality of first vent holes in communication (Continued)

with the channel thereof, through which the ionic wind delivered by the ionic wind supply is blown towards the substrate to be processed.

9 Claims, 9 Drawing Sheets

(51) Int. Cl.
  *G02F 1/1362* (2006.01)
  *H01L 21/687* (2006.01)
  *G02F 1/1368* (2006.01)

(56) References Cited

U.S. PATENT DOCUMENTS

| 2012/0313308 | A1* | 12/2012 | Yan | B25B 11/005 269/21 |
| 2016/0268157 | A1* | 9/2016 | Gong | G02F 1/1303 |
| 2018/0158715 | A1* | 6/2018 | Wang | H01L 21/68 |

FOREIGN PATENT DOCUMENTS

| CN | 103472603 A | 12/2013 |
| CN | 104658959 A | 5/2015 |
| KR | 10-2004-0041266 A | 5/2004 |
| KR | 10-2007-0071298 A | 7/2007 |
| KR | 10-2011-0099478 A | 9/2011 |

* cited by examiner

ELEVATING MECHANISM

CROSS-REFERENCE TO RELATED INVENTION

The present disclosure claims the benefit of Chinese Patent Application Invention No. 201610743003.3 filed on Aug. 26, 2016 in the State Intellectual Property Office of China, the whole disclosure of which is incorporated herein by reference.

BACKGROUND OF THE INVENTION

Field of the Invention

Embodiments of the present disclosure relate to the technical field of a substrate carrying mechanism device, and in particular, to an elevating mechanism.

Description of the Related Art

In a manufacturing procedure of the TFT-LCD (Thin Film Transistor Liquid Crystal Display) process, a plurality of processes are carried out during which a substrate is required to be placed on a carrying platform of an elevating mechanism. Therefore, in a period during which a substrate to be processed is placed and moved among different processes, it is often necessary to operate by a strut or struts of the elevating mechanism.

SUMMARY OF THE INVENTION

The embodiments of the present disclosure have been made to overcome or alleviate at least one aspect of the above mentioned disadvantages and/or shortcomings in the prior art, by providing an elevating mechanism in embodiments of the disclosure, such that an incidence of an electrostatic-breakdown phenomenon of a substrate to be processed may be decreased during an ascending-descending process thereof.

Following technical solutions are adopted in exemplary embodiments of the invention for achieving the above desired technical purposes.

According to an aspect of the exemplary embodiment of the present disclosure, there is provided an elevating mechanism configured to carry a substrate to be processed, including a plurality of struts, each of which is provided at a supporting end thereof with a support portion which is in contact with the substrate to be processed, by means of a supporting surface provided on the support portion when the elevating mechanism carries the substrate to be processed; and an ionic wind supply. Each of the plurality of struts is provided with a channel which is arranged inside a corresponding one of the plurality of the struts and penetrates therethrough and is configured to deliver an ionic wind outputted from the ionic wind supply into the corresponding one of the plurality of struts; and each of the plurality of struts is provided at least at a location of the supporting surface on the support portion with a plurality of first vent holes in communication with the channel thereof, through which the ionic wind delivered by the ionic wind supply is blown towards the substrate to be processed.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the elevating mechanism.

Figure 1:
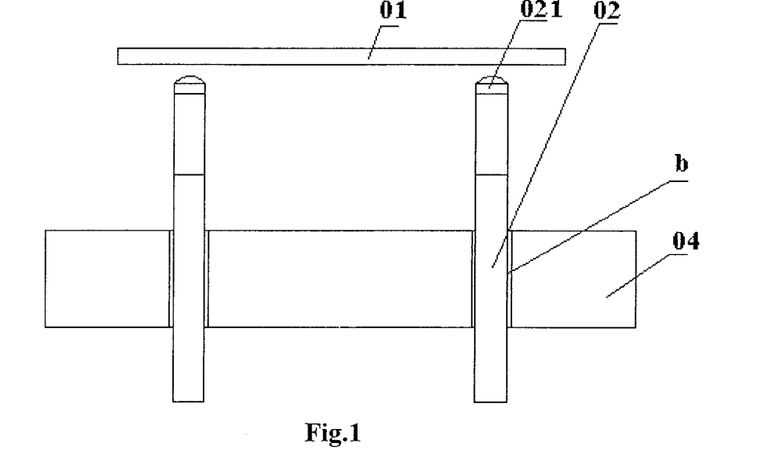
FIG. 1 illustrates a structural schematic view of an exemplary elevating mechanism for a substrate according to an exemplary embodiment of the disclosure.

According to an exemplary embodiment of the disclosure, an elevating mechanism is provided, as illustrated in FIG. 1, having a hard rubber end 021 which is provided at a top portion of each of its struts 02 and capable of moving up and down relative to a carrying platform 04 for carrying a substrate to be processed 01, by extending through respective mounting hole b provided on the carrying platform 04. Once the substrate to be processed 01 is delivered directly over the carrying platform 04, a plurality of struts 02 rise respectively through corresponding mounting holes b so as to support the substrate to be processed 01, and falls down along with the latter slowly until respective hard rubber end 021 is received/accommodated within the carrying platform 04, such that the substrate to be processed 01 is placed onto the carrying platform 04 steadily and stably. Once the processes are completed, the struts 02 rise, push the substrate to be processed 01 to depart from the carrying platform 04, and continue to support the substrate to be processed to rise to a certain height and then the substrate is grabbed and transferred away.

However, in this exemplary embodiment, it is inevitable that a friction is generated between the substrate to be processed 01 and the carrying platform 04 during processes of the substrate to be processed 01, such that a static charges may be easily generated on the substrate to be processed 01, especially in a moment the struts 02 push the substrate to be processed 01 to depart from the carrying platform 04; furthermore, since the hard rubber end 021 of the struts 02 has a relatively small end area and is formed by a relatively hard material, then a tip discharge or a point discharge may occur extremely easily at a position where the hard rubber end 021 contacts the substrate to be processed 01, resulting in an electrostatic-breakdown phenomenon there, such that metal layers or an ITO (Indium Tin Oxide) layer routed internally within the substrate to be processed 01 may be burned down.

Figure 2:
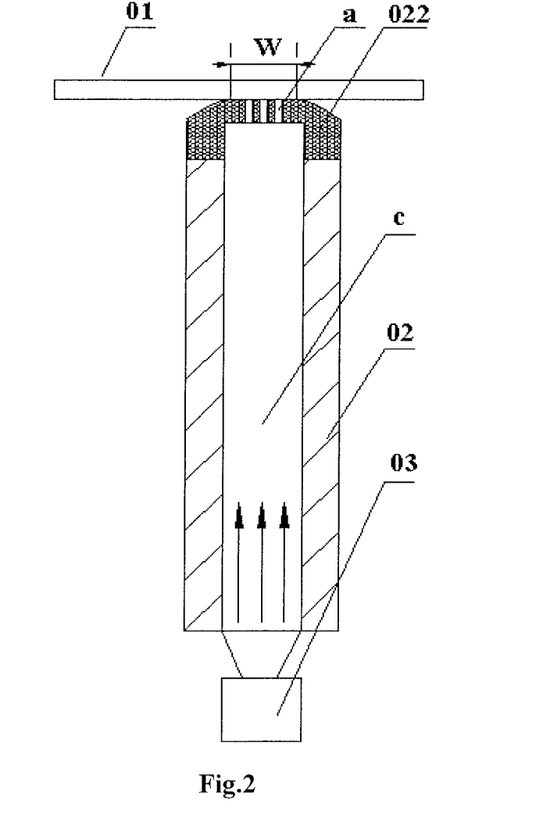
FIG. 2 illustrates a first structural schematic view of an elevating mechanism according to an exemplary embodiment of the disclosure.

Furthermore, according to a general technical concept of the present disclosure, there is provided an elevating mechanism as illustrate in FIG. 2, the elevating mechanism is configured to carry a substrate to be processed 01 and it comprises a plurality of struts 02 and an ionic wind supply 03. Since the plurality of struts 02 are identical in respective shape, size and structure, then, in order to facilitate a clear illustration in accompanying drawings, a single strut 02 is illustrated as exemplary embodiment in FIG. 2, and it was enlarged entirely to a certain scale as compared with the substrate to be processed 01. Each of the plurality of struts 02 is provided at a supporting end thereof with a support portion 022 which is in contact with the substrate to be processed 01, by means of a supporting surface provided at the supporting end of the support portion 022 of the corresponding strut 02 when the elevating mechanism carries the substrate to be processed 01. And by way of example, the ionic wind supply 03 is configured to deliver an ionic wind outputted therefrom into a channel 'c' of a corresponding one of the struts 02 via the channel 'c' which is arranged inside the corresponding one of the struts 02 and penetrates therethrough, for example. And each of the plurality of struts 02 is provided at least at a location of the supporting surface on the support portion 022 with a plurality of first vent holes each labeled by 'a' in communication with the channel 'c' thereof, through which the ionic wind delivered by the ionic wind supply 03 is blown towards the substrate to be processed 01.

It should be noticed that, firstly, the supporting end of a strut 02 refers to an end of the strut 02 which end is configured to support the substrate to be processed 01, i.e., an upper end illustrated in FIG. 2.

In the depiction of the disclosure, it should be understood that, an orientation or positional relationship referred to by terminologies 'above/over', 'below/under, 'left', 'right' and "top/upper" should be interpreted as an orientation or positional relationship relative to the strut 02, just intending to facilitate and simplify depiction of the disclosure rather than indicating or implying that the device or element thus referred to is necessarily positioned at a certain absolute orientation, or should necessarily be constructed/operated at a certain orientation. In other words, such terminologies should not be interpreted a limitation/restriction to the disclosure.

Secondly, the supporting surface of the support portion 022 refers to a portion of the support portion 022 being in contact with the substrate to be processed 01, at a supporting end thereof, when the strut 02 contacts with and supports the substrate to be processed 01 by means of the supporting end. As illustrated in FIG. 2, a portion 'W' which contacts between the supporting end of the support portion 022 and the substrate to be processed 01, functions as the supporting surface of the support portion 022.

Thirdly, an outlet at a top end of the channel 'c' of the strut 02 is in direct communication with the plurality of first vent holes (each labeled by 'a') of the support portion 022; the ionic wind delivered by the ionic wind supply 03 is blown through the top end of the channel 'c' and the plurality of first vent holes (each labeled by 'a') towards the substrate to be processed 01.

According to an embodiment of the disclosure, an elevating mechanism is provided which is configured to carry a substrate to be processed, comprising a plurality of struts each of which has a channel arranged inside a corresponding one of the plurality of the struts and penetrating therethrough, and an ionic wind supply. Each of the plurality of struts is provided at a supporting end thereof with a support portion which is intended to be in contact with the substrate to be processed, by means of a supporting surface provided on the support portion when the elevating mechanism is adopted to carry the substrate to be processed. The ionic wind supply and the channel are used to deliver an ionic wind outputted from the ionic wind supply into the corresponding one of the struts. Moreover, each of the plurality of struts is provided at least at a location of the supporting surface on the support portion with a plurality of first vent holes in communication with the channel thereof, through which the ionic wind delivered by the ionic wind supply is blown towards the substrate to be processed. Besides, due to an existence of the support portion provided at the supporting end of the corresponding strut, the channel provided within the corresponding strut, the ionic wind supply disposed on or within the corresponding strut, and the plurality of through-holes (i.e., the first vent holes) provided at least at a location of the supporting surface of the support portion in communication with the channel of the corresponding strut, then the ionic wind delivered towards the channel within the strut by the ionic wind supply is further blown towards the substrate to be processed through the through-holes of the support portion. Since a large number of dissociative positive and negative ions are carried within the ionic wind, then, when blown towards the substrate to be processed, the dissociative positive and negative ions are capable of being combined actively with the electrons on the substrate to be processed, so as to neutralize static charges on the substrate to be processed, and thus to decrease incidence of an electrostatic-breakdown phenomenon which may easily occur on the substrate to be processed when the substrate to be processed and the carrying platform are separated from each other, such that a yield rate of the substrate to be processed may be enhanced.

Figure 3:
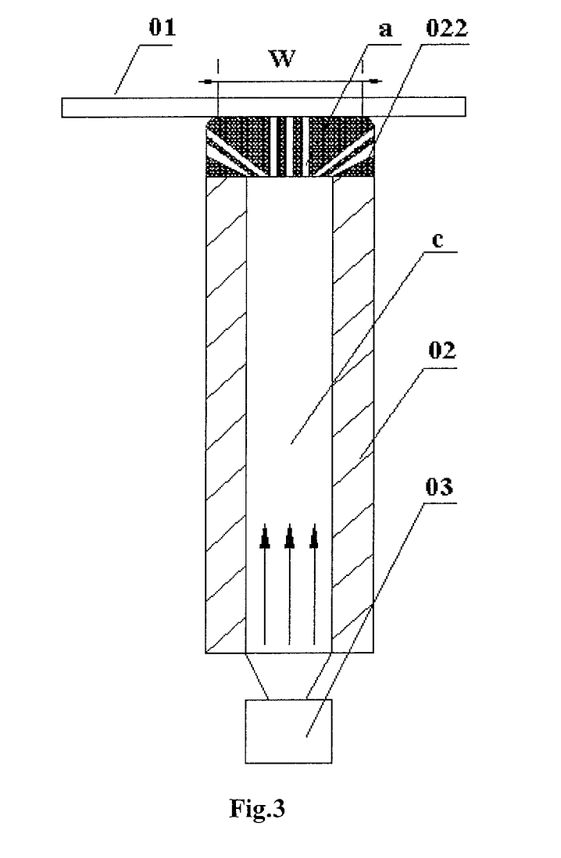
FIG. 3 illustrates a second structural schematic view of an elevating mechanism according to an exemplary embodiment of the disclosure.

The support portion 022 according to the embodiment may be a solid body as illustrated in FIG. 3, or a hollow construction as illustrated in FIG. 2, for example. Since the first vent holes (each labeled by 'a') which are through-holes are to be processed on the support portion 022, then, in order to save material and to simplify processes, it is a typical solution that the support portion 022 is configured to be the hollow construction as illustrated in FIG. 2. A support portion 022 of the hollow construction is illustrated in details hereinafter.

During the processes in which the substrate to be processed 01 is processed on the carrying platform, it is inevitable that static charges are generated and accumulated. If the plurality of first vent holes (each labeled by 'a') are provided at the location of the supporting surface of the support portion 022, when the strut 02 approaches a lower surface of the substrate to be processed 01, the ionic wind is blown towards the substrate to be processed 01 through the first vent holes (each labeled by 'a') provided at the supporting surface. Such a solution may decrease the static charges on the substrate to be processed 01. However, when the supporting surface of the support portion 022 is in contact with the lower surface of the substrate to be processed 01, the plurality of first vent holes (each labeled by 'a') are blocked by the lower surface, such that the static charges on the substrate to be processed 01 may not be further decreased, i.e., there may still portions of static charges remaining on the substrate to be processed 01. Therefore, when the strut 02 continues to push upwards the substrate to be processed 01, then, in a moment the substrate to be processed 01 and the carrying platform 04 are separated from each other, since the support portion 022 itself of the strut 02 is relatively slim as compared with the substrate to be processed 01, an electrostatic-breakdown phenomenon may easily occur on the substrate to be processed 01 due to an electrostatic discharge which still occurs between the support portion 022 and the substrate to be processed 01, such that a conductive metallic layer or conductive metallic layers on the substrate to be processed 01 may be burned down, resulting in a failure of the substrate to be processed 01.

Figure 4:
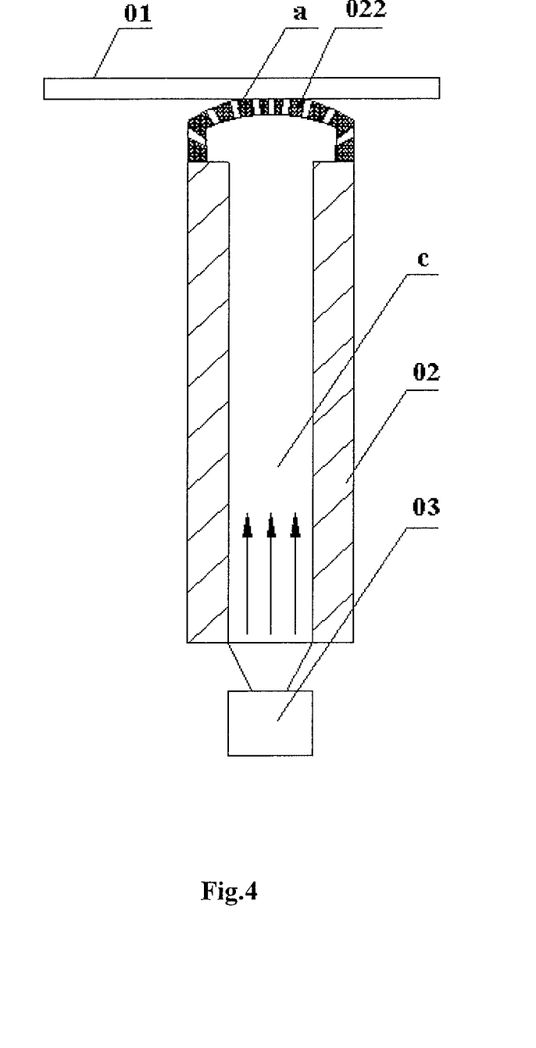
FIG. 4 illustrates a third structural schematic view of an elevating mechanism according to an exemplary embodiment of the disclosure.

On the basis of above embodiments, as illustrated in FIG. 4, the support portion 022 is configured to be a hollow construction, comprising: the supporting surface; and a sidewall of the support portion 022, which functions as another portion of the support portion 022 apart from the supporting surface and is also provided thereon with a plurality of second vent holes in communication with the channel 'c' of the strut 02.

Since the sidewall of the support portion 022 is not in contact with the lower surface of the substrate to be processed 01, once the supporting surface of the support portion 022 gets in contact with the lower surface of the substrate to be processed 01, the ionic wind may continue to be blown towards the substrate to be processed 01 such that throughout the ascending-descending process of the strut 02, the support portion 022 always blows the ionic wind towards the lower surface of the substrate to be processed 01, so as to remove continuously the static charges on the substrate to be processed 01, resulting in a decrease in a possibility of incidence of the electrostatic-breakdown phenomenon in the moment the substrate to be processed 01 and the carrying platform 04 are separated from each other.

In order to lower a risk that a surface scratch occurs at a contact position between the support portion 022 and the substrate to be processed 01 once there is a movement of a relative position between the strut 02 and the substrate to be processed 01, for example, as illustrated in FIG. 3, the supporting surface is substantially planar and flat, with edge locations of the supporting surface of the support portion 022 being processed into be rounded, so as to remove sharp edge angles at corners of the support portion 022; or otherwise the supporting surface of the support portion 022 is processed into an arc-shaped curved surface which is convex upwards, as illustrated in FIG. 2.

In order to decrease a local pressure intensity between the support portion 022 and the substrate to be processed 01, it is necessary to increase a contact area between the support portion 022 and the substrate to be processed 01 as large as possible. Referring to FIGS. 2 and 3, the supporting surface between the substrate to be processed 01 and the support portion 022 functions as the portion 'W' which contacts therebetween. It is apparent that, as illustrated in FIG. 3, in a case that the supporting surface is substantially planar with edges thereof being rounded, then, the contact area is larger than that in a form of arc-shaped curved surface in FIG. 2. Therefore, a typical solution is illustrated in FIG. 3, in which the supporting surface of the support portion 022 is made to be substantially planar, with edge locations of the supporting surface of the support portion 022 being processed to be rounded.

As shown in Figures which illustrate other embodiments hereinafter, the supporting surface of the support portion 022 in each Figure is illustrated as an arc-shaped curved surface which is convex upwards; however, it does not mean or imply that the solution in which the supporting surface of the support portion 022 is formed to be an arc-shaped curved surface which is convex upwards is a typical solution. On the contrary, a detailed depiction is already made as above, stating clearly that such a solution functions as a typical one. The supporting surface is illustrated to be arc-shaped curved surface, so as to facilitate illustration and depiction concerning an extension direction/trend of a gas flow, and to indicate that an existence of the sidewall which is not in contact with the substrate to be processed.

Figure 5:
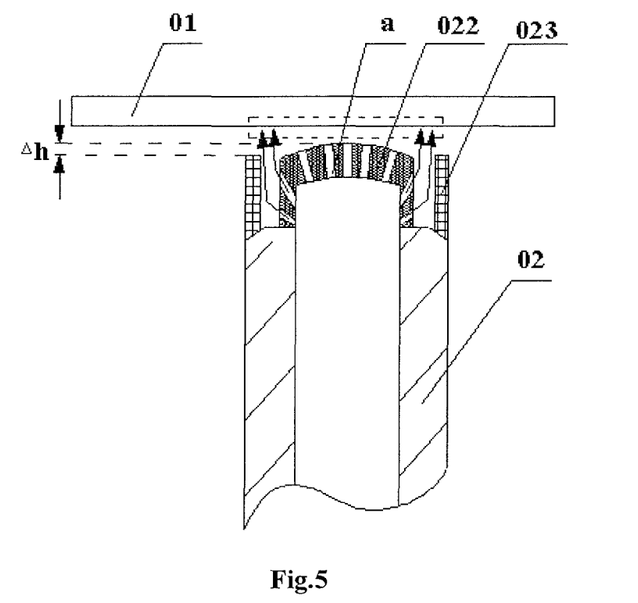
FIG. 5 illustrates a first structural schematic view of an elevating mechanism having a shield, according to an exemplary embodiment of the disclosure.

By way of example, as illustrated in FIG. 5, each of the plurality of struts 02 is further provided with a shield 023 disposed around a periphery of the support portion 022 with a gap between the shield 023 and the support portion 022, a top end of the shield 023 being located below a top end of the support portion 022.

The shield 023 is disposed around the periphery of the support portion 022, with a gap between the shield 023 and the support portion 022 for delivering a gas therethrough. As such, the ionic wind blown out from the second vent holes provided on the sidewall of the support portion 022, in a direction as illustrated by an arrow in FIG. 5, may be guided along an inner wall of the shield 023 towards the substrate to be processed 01, so as to decrease a windage loss of the ionic wind blown out from the second vent holes at the sidewall of the support portion 022 in other directions.

As illustrated in FIG. 5, there is a height difference $\Delta h$ between a top end of the shield 023 and a top end of the support portion 022, with the top end of the shield 023 being disposed lower than the top end of the support portion 022. As such, when the supporting surface of the support portion 022 is in contact with and supports the substrate to be processed 01, the shield 023 is not in contact with the substrate to be processed 01, thereby avoiding any scratch of surfaces of the substrate to be processed.

By way of example, a longitudinal section of the shield 023 is a plane in which a centerline of a corresponding one of the plurality of struts lies, and is patterned to be in a form of a rectangular shape, or a trapezoidal shape whose top edge is provided at a side adjacent to a corresponding one of the plurality of struts 02.

As illustrated in FIG. 5, once the shield 023 is sectioned along a plane in which a centerline of the strut 02 lies, the longitudinal section is patterned to be in a form of a rectangular shape, and two edges thereof respectively at both sides may be provided vertically in an extension direction of the strut 02, for example; and in this case, the edges at both sides of the rectangular shape extend in a same direction as that of the strut 02. In a case that the longitudinal section of the shield 023 is patterned to be in a form of a rectangular shape, once the ionic wind is subject to blockage and guidance of the shield 023, an area through which the ionic wind is blown towards the substrate to be processed 01 along the inner wall of the shield 023 is illustrated in a dashed box in FIG. 5.

Figure 6:
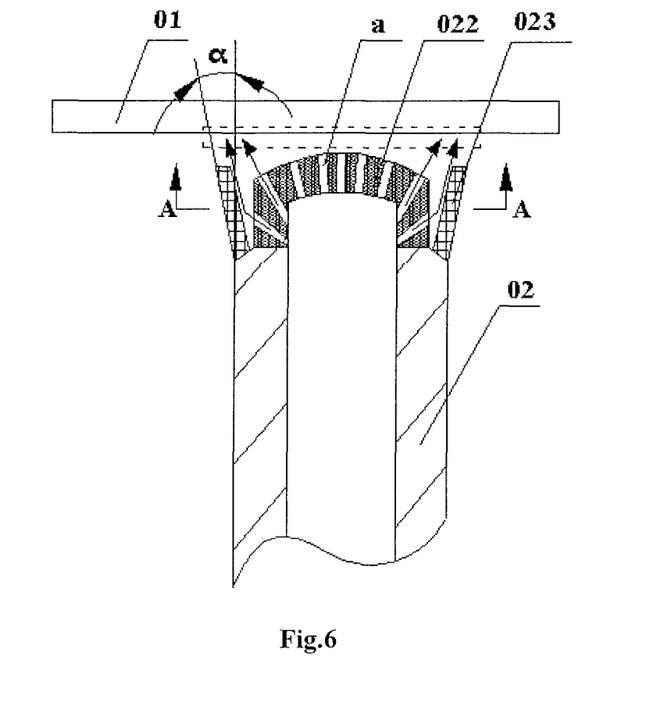
FIG. 6 illustrates a second structural schematic view of an elevating mechanism having a shield, according to an exemplary embodiment of the disclosure.

In order to enlarge a blowing scope of the ionic wind towards the substrate to be processed 01 so as to enhance a removal effect of static charges on the substrate to be processed 01 by the ionic wind, by way of example, the shield 023 is provided in a shape as illustrated in FIG. 6, i.e., the longitudinal section of the shield 023 therein is patterned to be in a form of a trapezoidal shape whose top edge is provided at a side adjacent to the strut; in other words, as illustrated in FIG. 6, the two edges of the trapezoidal shape at both sides extend upwards divergently at the top end of the strut 02 in the extension direction of the strut 02. Then an area through which the ionic wind is blown towards the substrate to be processed 01 along the inner wall of the shield 023 is illustrated in a dashed box in FIG. 6. By comparison of positions of the dashed boxes in FIG. 5 and FIG. 6 respectively, it can be known that, the blowing scope of the ionic wind in a case of the trapezoidal-shaped longitudinal section of the shield 023 is larger than that in a case of the rectangular-shaped longitudinal section of the shield 023.

However, in consideration that once the substrate to be processed 01 is supported and delivered by the struts 02, each strut 02 is to be received within a corresponding one of mounting holes 'b' of the carrying platform 04, e.g., as illustrated in FIG. 1, in order to decrease an effect of the mounting holes 'b' on a flatness of the carrying platform 04, it is necessary to set apertures of the mounting holes 'b' as small as possible. Therefore, for example, as illustrate in FIG. 6, in a case that the longitudinal section of the shield 023 is patterned to be in a form of a trapezoidal shape whose top edge is provided at a side adjacent to a corresponding one of the plurality of struts, then an angle α between one of the two edges at both sides of the trapezoidal shape and a vertical direction in which the corresponding strut 02 extends may not exceed 30°.

Figure 7:
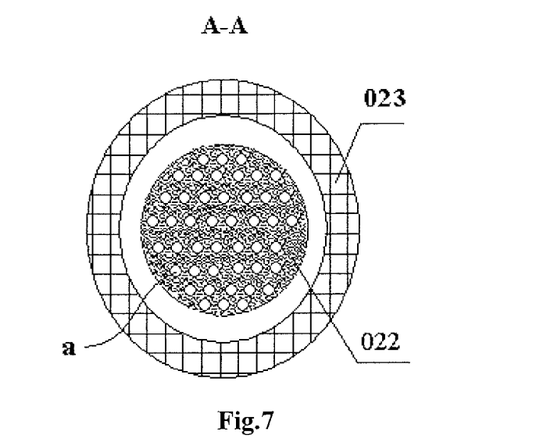
FIG. 7 illustrates a sectional view of the shield as illustrated in FIG. 6, in a direction along a line A-A of the latter.

By way of example, as illustrated in FIG. 7 which illustrates a sectional view of the shield 023 as illustrated in FIG. 6, in a direction along an line A-A of the latter, a cross section of the shield 023 is a plane perpendicular to the centerline of a corresponding one of the plurality of struts 02, and is patterned to be in a form of a circular shape. As such, a surrounding guiding surface for the ionic wind is defined, by which a parallel or divergent stream of the ionic wind is formed which is essentially round in cross section thereof.

In order to obtain a uniform distribution of the ionic wind all around locations on the substrate to be processed 01 corresponding to respective support portion 022 of each of the plurality of struts 02, which ionic wind is blown by respective support portion 022, for example, the cross section of the shield 023 is patterned to be centrosymmetric. Moreover, on the basis thereof, in order to increase a blowing area of the ionic wall all around locations on the substrate to be processed 01 corresponding to respective support portion 022 of each of the plurality of struts 02, by way of example, the cross section of the shield 023 is patterned to be in a form of a circular shape.

Figure 8:
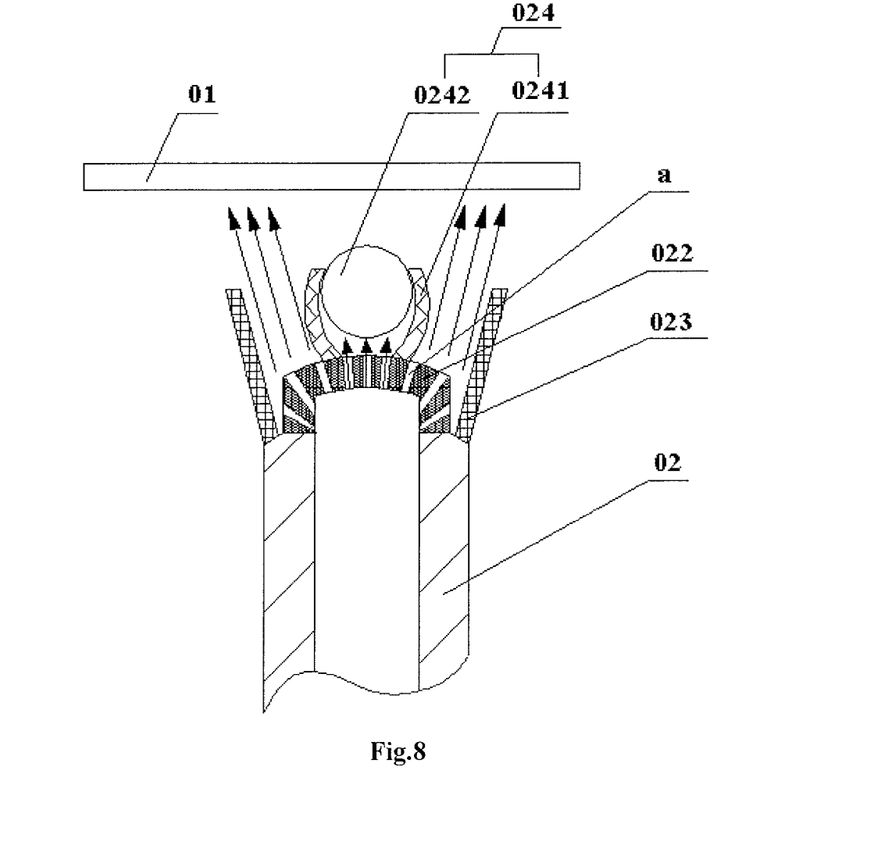
FIG. 8 illustrates a schematic view of an operation process of an elevating mechanism provided with an auxiliary support portion, according to an exemplary embodiment of the disclosure.

Furthermore, as illustrated in FIG. 8, the support portion 022 is further provided with an auxiliary support portion 024 which comprises a dome cover 0241 in a partially spherical shell shape provided on the supporting surface of the support portion 022 and a floating ball 0242 provided within the dome cover 0241, and the dome cover 0241 is further provided at a top end thereof with an opening, a diameter of which is smaller than that of the floating ball 0242, such that the floating ball 0242 is floatable within the dome cover 0241 and may float upwards until it gets stuck rotatably at the opening.

When the strut 02 is not in contact with the substrate to be processed 01, as illustrated in FIG. 8, the floating ball 0242 of the auxiliary support portion 024 may float upwards to the top portion of the dome cover 0241, under the action of the ionic wind blown out by the plurality of first vent holes (each labeled by 'a') on the supporting surface of the support portion 022, as in a direction illustrated by an arrow in FIG. 8. Moreover, since a diameter of the opening at the top end of the dome cover 0241 is less than that of the floating ball 0242, the floating ball 0242 may float within the dome cover 0241 and is restricted therein by the dome cover 0241 at the top portion thereof without jumping out therefrom. In a case that the floating ball 0242 is restricted at the top end of the dome cover 0241, the ionic wind blown out through the plurality of first vent holes (each labeled by 'a') of the supporting surface of the support portion 022 is blocked, then the ionic wind blown out through the plurality of second vent holes on the sidewall of the support portion 022 is guided along a periphery of the shield 023 between an external side of the dome cover 0241 and an internal side of the shield 023 towards corresponding regions on the substrate to be processed 01, so as to neutralize the static charges on the substrate to be processed 01.

Figure 9:
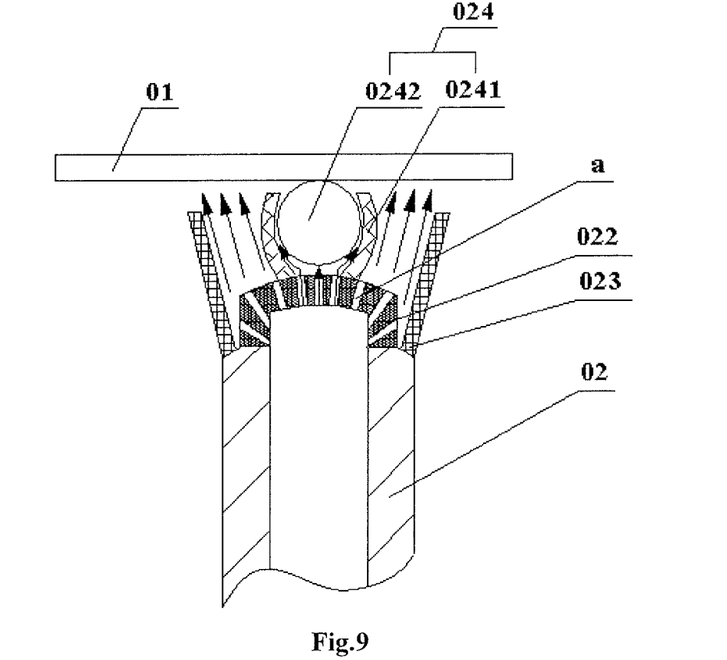
FIG. 9 illustrates a schematic view of an operation process of an elevating mechanism provided with an auxiliary support portion, according to an exemplary embodiment of the disclosure.

As illustrated in FIG. 9, once the strut 02 just gets in contact with the substrate to be processed 01, the floating ball 0242 contacts with the lower surface of the substrate to be processed 01 above all. After that, since the floating ball 0242 is pushed against the top portion of the dome cover 0241 by the ionic wind blown out through the plurality of first vent holes (each labeled by 'a'), after the floating ball 0242 contacts with the lower surface of the substrate to be processed 01, as the strut 02 continues to rise, the floating ball 0242 is pressed downwards within the dome cover 0241 by the substrate to be processed 01, in a direction as illustrated by an arrow in FIG. 9, the ionic wind blown out through the plurality of the first vent holes (each labeled by 'a') on the supporting surface of the support portion 022 may further pass through the gap between the dome cover 0241 and the floating ball 0242 and in turn blown upwards to the lower surface of the substrate to be processed 01. In other words, in this process, the plurality of first vent holes (each labeled by 'a') on the supporting surface of the support portion 022 still blow the ionic wind towards the lower surface of the substrate to be processed 01. As such, on one hand, the ionic wind continuously neutralize the static charges on the substrate to be processed 01; on the other hand, as a position of the floating ball 0242 varies within the dome cover 0241, e.g., during a process in which the floating ball 0242 continuously moves downwards by downward suppression of the substrate to be processed 01, then a buffering stage may be provided by a upward thrust of an elevating force applied onto the floating ball 0242 by the stream of the ionic wind. Thereby, during the buffering stage, since the lower surface of the substrate to be processed 01 keeps in continuous direct contact with the floating ball 0242 rather than the supporting surface of the support portion 022 of the strut 02, there is no direct rigid contact between the supporting surface of the support portion 022 of the strut 02 and the substrate to be processed 01; in other words, there is no contact force existing between the supporting surface of the support portion 022 of the strut 02 and the substrate to be processed 01. Typically, for example, in a case that the floating ball 0242 moves downwards slowly, then, on every occasion during this continuously downward movement of the floating ball 0242, it may be considered that the elevating force applied on the floating ball 0242 and a contact pressure between the floating ball 0242 and the lower surface of the substrate to be processed 01 are in a force-balanced condition, resulting in that both speed and acceleration of the floating ball 0242 may be considered to be zero.

Figure 10:
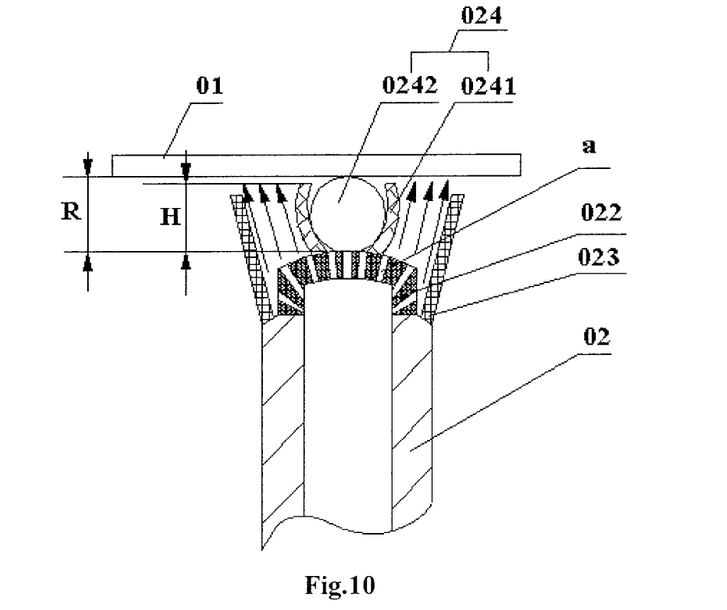
FIG. 10 illustrates a schematic view of an operation process of an elevating mechanism provided with an auxiliary support portion, according to an exemplary embodiment of the disclosure.

Next, as illustrated in FIG. 10, the strut 02 still rises continuously such that the floating ball 0242 is suppressed downwards until it reaches the supporting surface of the support portion 022 at a bottom end of the dome cover 0241; then the floating ball 0242 blocks the plurality of first vent holes (each labeled by 'a') on the supporting surface of the support portion 022, such that the buffering stage is terminated. After that, the ionic wind blown out through the plurality of second vent holes on the side wall of the support portion 022 is guided all the time along a periphery of the shield 023 between the external side of the dome cover 0241 and the internal side of the shield 023 so as to blow towards corresponding locations on the substrate to be processed 01, until the strut 02 pushes the substrate to be processed 01 once again to a specified position, e.g., pushes the substrate to be processed to rise again, so as to depart therefrom. As such, on one hand, the static charges on the substrate to be processed 01 are continuously neutralized; on the other hand, by the upwards thrust action of the gas flow, the contact pressure between the strut 02 and the substrate to be processed 01 may still be alleviated continuously.

Hereby, at a moment the strut 02 which is provided with the auxiliary support 024 gets in contact with the substrate to be processed 01, a buffering stage may be provided for the contact between the strut 02 and the substrate to be processed 01, by a change in position of the floating ball 0242 within the dome cover 0241, so as to decrease a possibility that crushed points at the contact position between the supporting surface of the support portion 022 and the substrate to be processed 01 are created due to an excessive local pressure intensity at the moment a rigid contact is established between the supporting surface of the support portion 022 and the substrate to be processed 01.

On the basis thereof, by way of example, as illustrated in FIG. 10, a diameter of the floating ball 0242 is larger than a height of the dome cover 0241.

It should be noticed that, the height of the dome cover 0241 refers to a height value in the extension direction of the strut 02 as illustrated in FIG. 10. It may be known from FIG. 10 that, the height H of the dome cover 0241 is smaller than the diameter R of the floating ball 0242, such that the top end of the dome cover is not in contact with the lower surface of the substrate to be processed 01 all the time.

As such, as illustrated in FIG. 10, once the struts 02 suppress the floating ball 0242 downwards to the supporting surface of the support portion 022 at the bottom end of the dome cover 0241, the bottom end of the floating ball 0242 blocks the plurality of the first vent holes (each labeled by 'a') on the supporting surface of the support portion 022. Since the diameter of the floating ball 0242 is larger than the height of the dome cover 0241, a top end of the floating ball 0242 is still higher than the top end of the dome cover 0241, therefore the substrate to be processed 01 still abuts against the top end of the floating ball 0242 so as to avoid any scratch of the surface of the substrate to be processed 01 caused by the top end of the dome cover 0241. In addition, since a bottom end of the floating ball 0242 abuts directly against the supporting surface of the support portion 022, then the stability of supporting the substrate to be processed 01 by means of the floating ball 0242 is superior over the stability of supporting the substrate to be processed 01 by means of the top end of the dome cover 0241.

Figure 11:
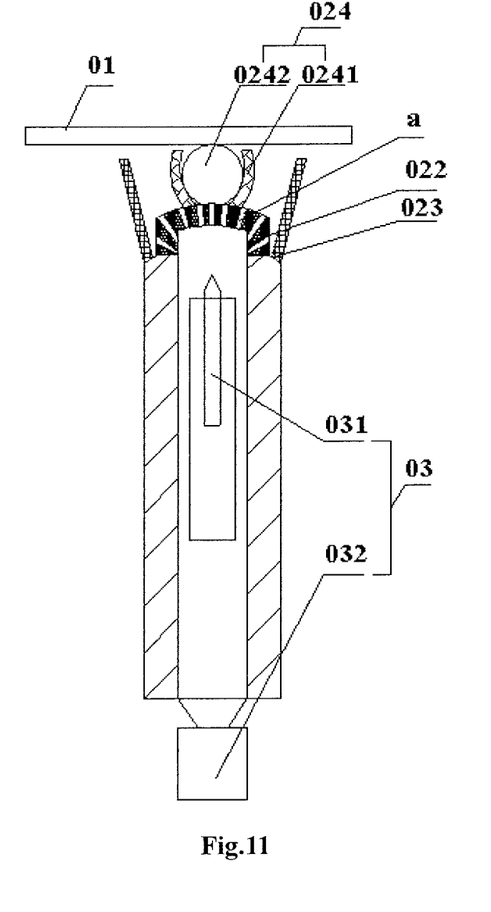
FIG. 11 illustrates a structural schematic view of an elevating mechanism provided with an ion source and a ventilation device, according to an exemplary embodiment of the disclosure.

Furthermore, as illustrated in FIG. 11, specifically, for example, the ionic wind supply 03 comprises an ion source 031 mounted within an inner wall of the channel 'c' of each of the plurality of struts 02; and a ventilation device 032 provided at an entrance of the channel 'c' of each of the plurality of struts 02.

Figure 12:
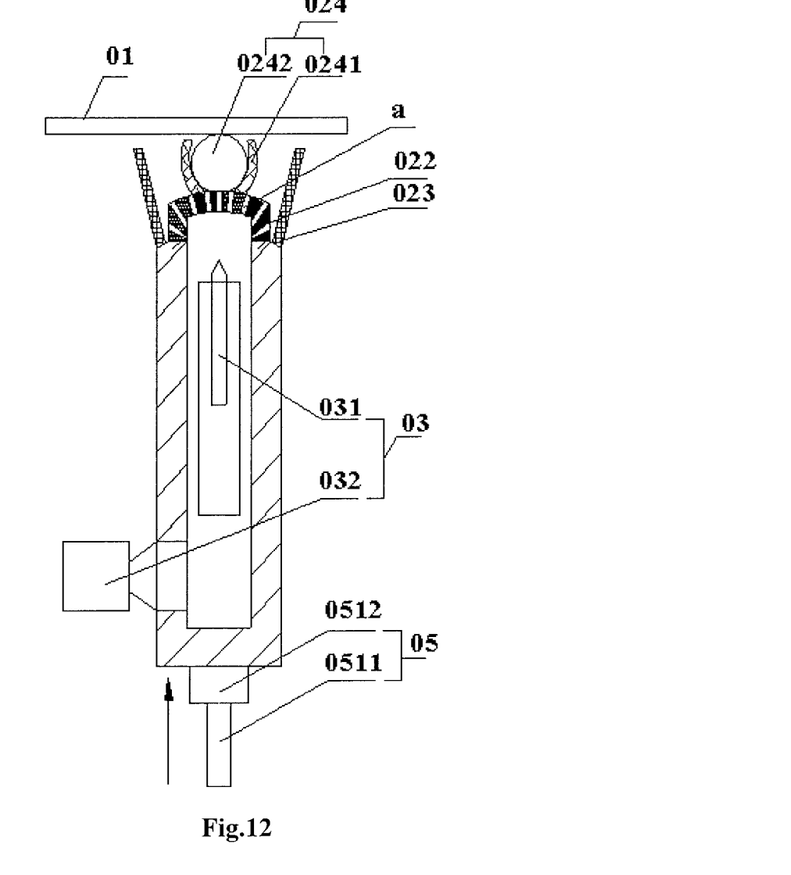
FIG. 12 illustrates a structural schematic view of an elevating mechanism provided with a drive unit, according to an exemplary embodiment of the disclosure.

It should be noticed that, the entrance of the channel 'c' of the strut 02 is for example the bottom end of the strut 02 as illustrated in FIG. 11. Besides, the entrance of the channel 'c' of the strut 02 may further be instead provided at any position penetrating the sidewall of the strut 02. The specific position of the entrance of the channel 'c' is not specifically delimited in the disclosure, as long as a gas flow may be passed into the channel 'c' of the strut 02 through the entrance of the channel 'c' by the ventilation device 032, then the gas flow passed therethrough is converted into the ionic wind through the ion source 031, which is blown towards the substrate to be processed 01 through the plurality of vent holes (each labeled by 'a') on the support portion 022. By way of example, as illustrated in FIG. 12, the entrance of the channel 'c' of the strut 02 is provided at the opening which penetrates the sidewall of the strut 02. For example, when the elevating mechanism of the embodiment of the disclosure is provided with a drive unit 05, the drive unit 05 is often required to be provided at the bottom end of the strut 02. Therefore, the entrance of the channel 'c' of the strut is alternatively provided on the sidewall of the strut 02.

As such, an gas is wafted by the ventilation device 032 inwards the channel 'c' of the strut 02, and positive and negative ions are produced by the ion source 031 which is fixed on the inner wall of the channel 'c' of the strut 02. When the gas flows through the ion source 031 within the channel 'c', the positive and negative ions generated by the ion source 031 are taken away thereby, such that the gas flow is converted into an ionic wind which is then wafted towards the substrate to be processed 01. Once the positive and negative ions carried along within the ionic wind are blown to the substrate to be processed 01, the positive and negative ions neutralize the charges accumulated on the substrate to be processed 01 so as to decrease the static charges on the substrate to be processed 01.

Specifically, as illustrated in FIG. 11, the ion source 031 is provided adjacent to the supporting end of each of the plurality of struts 02, and the ion source 031 is a metallic discharge needle.

As illustrated in FIG. 11, the ion source 031 is a metallic discharge needle whose top portion is provided with a tip. When the tip of the metallic discharge needle is disposed at the strut 02, the tip is provided at a side of the strut 02 adjacent to the supporting end of the strut 02. Once the metallic discharge needle communicates with an external power supply, the tip may discharge to release positive and negative ions. Since the strut 02 is also formed by a metallic material, in order to prevent the strut 02 from being electrically charged, the so-called metallic discharge needle herein refers to an integral structure in which the metallic discharge needle itself is provided within an insulative housing with the tip of the metallic discharge needle being exposed externally, such that the positive and negative ions released by the discharge of the metallic discharge needle are carried away and converted by the gas flow delivered therein from the ventilation device 032 into the ionic wind to be blown out; as a result, the insulative housing and the metallic discharge needle disposed therein form the ion source 031 collectively.

Since the positive and negative ions produced by a tip discharge or a point discharge of the metallic discharge needle and then dissociated in the air are in an unsteady condition, then these positive and negative ions, when existing in the air for a long time, may be combined with each other and thus consumed so as to decrease in number. Therefore, by way of example, the metallic discharge needle is provided adjacent to the supporting end, within the channel 'c' of each of the plurality of struts 02, such that the positive and negative ions produced by discharge of the metallic discharge needle may soon be taken away swiftly by an incoming gas flow towards an adjacent substrate to be processed 01, enhancing an utilization rate of the positive and negative ions released by the discharge at the tip of the metallic discharge needle.

Furthermore, as illustrated in FIG. 12, each of the plurality of the struts 02 is connected with and driven to move up and down by a drive unit 05.

As such, by the drive unit 05, the strut 02 is driven to move up and down, so as to keep a speed of the strut 02 constant, and to avoid that some crushed points are created on the surface of the substrate to be processed 01 due to an excessive local pressure intensity between the strut 02 and the substrate to be processed 01 caused by an acceleration.

As to a condition of a plurality of struts 02, in order to save cost, and to improve consistency in height thereamong during an ascending-descending process of the plurality of struts 02, by way of example, a single drive unit 05 is provided which is connected with the plurality of struts 02 respectively and simultaneously by supports, such that the single drive unit 05 may drive the ascending-descending process of the plurality of struts 02 simultaneously, so as to enhance stability of the substrate to be processed 01 during the ascending-descending process and to prevent the substrate to be processed 01 from falling down due to unstable placement thereof resulting from height inconsistency at positions of the plurality of struts 02.

Specifically, as illustrate in FIG. 12, the drive unit 05 is a linear motor, a secondary stage 0512 of which is connected fixedly with a corresponding one of the plurality of the struts 02.

A primary stage 0511 of the linear motor is fixed along a movement direction of the strut 02, and the secondary stage 0512 of the linear motor is connected with the strut 02 fixedly and is movable linearly back and forth along the primary stage 0511, as in a direction indicated by an arrow illustrated in FIG. 12. When the strut 02 is required to move up and down, the secondary stage 0512 of the linear motor may bring the strut 02 into a corresponding up-and-down movement with a thrust action thereof.

Figure 13:
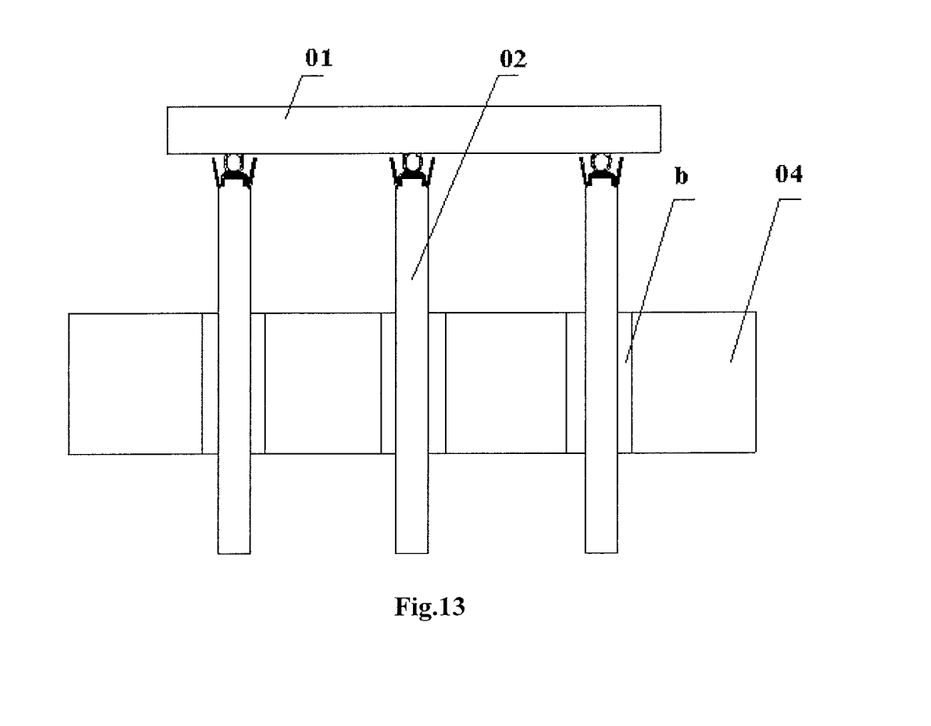
FIG. 13 illustrates a structural schematic view of an elevating mechanism comprising a carrying platform, according to an exemplary embodiment of the disclosure.

Furthermore, as illustrated in FIG. 13, the elevating mechanism of the disclosure further comprises a carrying platform 04, on which a plurality of mounting holes 'b' are provided in an one-to-one correspondence to the plurality of struts 02 respectively, wherein a diameter of each of the plurality of mounting holes 'b' is larger than that of a corresponding one of the plurality of struts 02.

As such, the plurality of struts 02 may rise upwards or fall downwards relative to the carrying platform 04 through the mounting holes 'b' respectively; and may be retracted through the mounting holes 'b' to positions below the carrying platform 04 once the substrate to be processed 01 is placed on the carrying platform 04.

As to processes of the substrate to be processed 01 having a relatively large size thereof, a stationarity of the substrate to be processed 01 may hardly be secured during these processes in a case that the substrate to be processed 01 is directly supported by the struts 02. And an excessively large pressure applied on the struts 02 may easily result in a relatively high fault rate of the struts 02. Therefore, by way of example, by a descending of the plurality of struts 02 at a constant speed, the substrate to be processed 01 is placed onto the carrying platform 04 and the processed thereon, so as to ensure the stability of the substrate to be processed 01 during these processes. Once the processes on the carrying platform 04 are completed, the plurality of struts 02 rise through the mounting holes 'b' provided on the carrying platform 04, as illustrated in FIG. 13, such that the substrate to be processed 01 is pushed upwards to depart from the carrying platform 04 and to further rise until arriving and then stopping at a specified position, and delivered to a next process by a moving mechanical arm.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An elevating mechanism configured to carry a substrate to be processed, comprising:
   a plurality of struts, each of which is provided at a supporting end thereof with a support portion which is in contact with the substrate to be processed, by means of a supporting surface provided on the support portion when the elevating mechanism carries the substrate to be processed; and
   an ionic wind supply,
   wherein each of the plurality of struts is provided with a channel which is arranged inside a corresponding one of the plurality of the struts and penetrates therethrough and is configured to deliver an ionic wind outputted from the ionic wind supply into the corresponding one of the plurality of struts;
   wherein each of the plurality of struts is provided at least at a location of the supporting surface on the support portion with a plurality of first vent holes in communication with the channel thereof, through which the ionic wind delivered by the ionic wind supply is blown towards the substrate to be processed; and
   wherein each of the plurality of struts is provided with a shield disposed around a periphery of the support portion with a gap between the shield and the support portion, a top end of the shield being located below a top end of the support portion.

2. The elevating mechanism according to claim 1, wherein the support portion is configured to be a hollow construction, comprising:
   the supporting surface; and
   a sidewall of the support portion, which functions as another portion of the support portion apart from the supporting surface and is also provided with a plurality of second vent holes in communication with the channel of the corresponding one of the plurality of struts.

3. The elevating mechanism according to claim 2, wherein the support portion is further provided thereon with an auxiliary support portion which comprises a dome cover provided on the supporting surface of the support portion and a floating ball provided within the dome cover, and the dome cover is further provided at a top end thereof with an opening, a diameter of which is smaller than that of the floating ball.

4. The elevating mechanism according to claim 3, wherein a diameter of the floating ball is larger than a height of the dome cover.

5. The elevating mechanism according to claim 1, wherein
   a longitudinal section of the shield is a plane in which a centerline of the corresponding one of the plurality of struts lies, and is patterned to be in a form of a rectangular shape, or a trapezoidal shape whose top edge is provided at a side adjacent to the corresponding one of the plurality of struts.

6. The elevating mechanism according to claim 5, wherein
   a cross section of the shield is a plane perpendicular to the centerline of the corresponding one of the plurality of struts, and is patterned to be in a form of a circular shape.

7. The elevating mechanism according to claim 1, wherein the ionic wind supply comprises:
   an ion source mounted within an inner wall of the channel of each of the plurality of struts;
   wherein the ion source is provided adjacent to the supporting end, within the channel of each of the plurality of struts; and
   wherein the ion source is a metallic discharge needle.

8. The elevating mechanism according to claim 1, wherein each of the plurality of the struts is connected with and driven to move up and down by a drive unit, the drive unit being a linear motor, a secondary stage of which is connected fixedly with the corresponding one of the plurality of the struts.

9. The elevating mechanism according to claim 1, further comprising a carrying platform, on which a plurality of mounting holes are provided in an one-to-one correspondence to the plurality of struts respectively, wherein a diameter of each of the plurality of mounting holes is larger than that of the corresponding one of the plurality of struts.

* * * * *